(12) United States Patent
Bulovic et al.

(10) Patent No.: US 6,287,712 B1
(45) Date of Patent: *Sep. 11, 2001

(54) COLOR-TUNABLE ORGANIC LIGHT EMITTING DEVICES

(75) Inventors: Vladimir Bulovic, Metuchen; Stephen R. Forrest, Princeton, both of NJ (US); Mark E. Thompson, Anaheim, CA (US)

(73) Assignees: The Trustees of Princeton University, Princeton, NJ (US); The University of Southern California, Los Angeles, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/058,142

(22) Filed: Apr. 10, 1998

(51) Int. Cl.[7] .............................. H05B 33/14; H05B 33/10

(52) U.S. Cl. .......................... 428/690; 428/917; 313/504; 313/506; 427/66; 257/94

(58) Field of Search ..................................... 428/690, 691, 428/917, 704; 313/504, 502, 506; 345/36, 45, 76; 427/66; 257/94

(56) References Cited

U.S. PATENT DOCUMENTS

| | | | |
|---|---|---|---|
| 5,281,489 | 1/1994 | Mori et al. | 428/690 |
| 5,378,403 * | 1/1995 | Shacklette | 252/500 |
| 5,536,949 * | 7/1996 | Hosokawa et al. | 257/40 |
| 5,540,999 | 7/1996 | Yamamoto et al. | 428/411 |
| 5,554,220 | 9/1996 | Forrest et al. | |
| 5,703,436 | 12/1997 | Forrest et al. | |
| 5,707,745 | 1/1998 | Forrest et al. | 428/432 |
| 5,717,289 | 2/1998 | Tanaka | 313/503 |
| 5,908,581 * | 6/1999 | Chen et al. | 252/301.16 |

OTHER PUBLICATIONS

Berggren, M., et al., Light Amplification in Organic Thin Films Using Cascade Energy Transfer, *Nature* 389, pp. 466–467, Oct. 1997.

Forrest, S.R., et al., Laser Focus World, Feb. 1995, pp. 99–107.

Garbuzov, D.Z., et al., *Chem. Phys. Lett*, 249, pp. 433–437, Feb. 1996.

Kalinowski, J., et al., "Electroabsorption Study of Excited States in Hydrogen–bonding Solids: Epindolidione and Linear Transquinacridone," *Chem. Phys.* 182, (1994), pp. 341–352. (no month).

Kido, J., et al., *Appl. Phys. Lett.*, 65, pp. 2124–2126, Oct. 1994.

Kido, J., et al., *J. Alloys and Compounds*, 192, pp. 30–33. (no month).

Kijima, Y., et al., *IEEE Transactions on Electron Devices*, 44, pp. 1222–1227, Aug. 1997.

Littman, J., et al., *J. Appl. Phys.*, 72, pp. 1957–1960, Sep. 1992.

(List continued on next page.)

Primary Examiner—Marie Yamnitzky
(74) Attorney, Agent, or Firm—Kenyon & Kenyon

(57) ABSTRACT

A method for tuning the wavelength of light emitted by an organic light emitting device. An emissive dopant molecule is selected, adapted to emit light when present as a dopant in an emissive layer of the organic light emitting device. The wavelength of light emitted by said emissive dopant molecule depends on the local dipole moment of the emissive layer. The local dipole moment of the emissive layer that would result in said emissive dopant molecule emitting a desired wavelength of light is determined, and an emissive layer is fabricated, doped with the emissive dopant molecule and having the local dipole moment that results in the emissive dopant molecule emitting the desired wavelength of light.

38 Claims, 5 Drawing Sheets

OTHER PUBLICATIONS

Martin, M., et al., "Ultrafast Intramolecular Charge Transfer in the Merocyanine Dye DCM," *Chem. Phys.* 192, pp. 367–377. (no month).

Sano, T., et al., *Japan J. Appl. Phys.*, 34, pp. 1883–1887, Apr. 1995.

Schmidbaur, H., et al., *Z. Naturforsch*, B 46, 901 (1991). (no month).

Shen, Z., et al., *Science*, 276, pp. 2009–2011, Jun. 1997.

Tang, C.W., et al., *Appl. Phys. Lett.* 51, pp. 913–915, Sep. 1987.

Tang, C.W., "Electroluminescence of Doped Organic Thin Films," *J. Appl. Phys.* 65, pp. 3610–3616, May 1989.

Tasch, S., et al., *Adv. Mater.*, 9, pp. 33–36, (1997). (no month).

Tsutsui, T., et al., *Appl. Phys. Lett.*, 65, pp. 1868–1870, Oct. 1994.

\* cited by examiner

COLOR-TUNABLE ORGANIC LIGHT EMITTING DEVICES

GOVERNMENT RIGHTS

This invention was made with Government support under Contract No. F33615-94-11414 awarded by DARPA and Contract No. BES-96-12244 awarded by NSFOS&E. The government has certain rights in this invention.

FIELD OF THE INVENTION

The present invention is directed to organic light emitting devices (OLEDs) comprising an emissive layer. In particular, the wavelength of light emitted by the emissive layer may be tuned by varying the concentrations of polar dopant molecules in the emissive layer.

BACKGROUND OF THE INVENTION

Organic light emitting devices (OLEDs) are comprised of several organic layers in which one of the layers is comprised of an organic material that can be made to electroluminesce, by applying a voltage across the device. C. W. Tang et al., *Appl. Phys. Lett.* 51, 913 (1987). Certain OLEDs have been shown to have sufficient brightness, range of color and operating lifetimes for use as a practical alternative technology to LCD-based full color flat-panel displays. S. R. Forrest, P. E. Burrows and M. E. Thompson, Laser Focus World, February 1995. Since many of the thin organic films used in such devices are transparent in the visible spectral region, they allow for the realization of a completely new type of display pixel in which red (R), green (G), and blue (B) emitting OLEDs are placed in a vertically stacked geometry to provide a simple fabrication process, a small R-G-B pixel size, and a large fill factor.

A transparent OLED (TOLED), which represents a significant step toward realizing high resolution, independently addressable stacked R-G-B pixels, was reported in U.S. Pat. No. 5,703,436, Forrest et al. This TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg—Ag—ITO electrode layer for electron-injection. A device was disclosed in which the ITO side of the Mg—Ag13 ITO electrode layer was used as a hole-injecting contact for a second, different color-emitting OLED stacked on top of the TOLED. Each layer in the stacked OLED (SOLED) was independently addressable and emitted its own characteristic color, red or blue. This colored emission could be transmitted through the adjacently stacked transparent, independently addressable, organic layer, the transparent contacts and the glass substrate, thus allowing the device to emit any color that could be produced by varying the relative output of the red and blue color-emitting layers.

U.S. Pat. No. 5,707,745, Forrest et al, disclosed an integrated SOLED for which both intensity and color could be independently varied and controlled with external power supplies in a color tunable display device. U.S. Pat. No. 5,707,745, thus, illustrates a principle for achieving integrated, full color pixels that provide high image resolution, which is made possible by the compact pixel size. Furthermore, relatively low cost fabrication techniques, as compared with prior art methods, may be utilized for making such devices.

Such devices whose structure is based upon the use of layers of organic optoelectronic materials generally rely on a common mechanism leading to optical emission. Typically, this mechanism is based upon the radiative recombination of a trapped charge. Specifically, OLEDs are comprised of at least two thin organic layers between an anode and a cathode. The material of one of these layers is specifically chosen based on the material's ability to transport holes, a "hole transporting layer" (HTL), and the material of the other layer is specifically selected according to its ability to transport electrons, an "electron transporting layer" (ETL). With such a construction, the device can be viewed as a diode with a forward bias when the potential applied to the anode is higher than the potential applied to the cathode. Under these bias conditions, the anode injects holes (positive charge carriers) into the HTL, while the cathode injects electrons into the ETL. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. These excitons are trapped in the material which has the lowest energy. Recombination of the short-lived excitons may be visualized as an electron dropping from a lowest unoccupied molecular orbital (LUMO) to a highest occupied molecular orbital (HOMO), with relaxation occurring, under certain conditions, preferentially via a photoemissive mechanism.

The materials that function as the ETL or HTL of an OLED may also serve as the medium in which exciton formation and electroluminescent emission occur. Such OLEDs are referred to as having a "single heterostructure" (SH). Alternatively, the electroluminescent material may be present in a separate emissive layer between the HTL and the ETL in what is referred to as a "double heterostructure" (DH).

In a single heterostructure OLED, either holes are injected from the HTL into the ETL where they combine with electrons to form excitons, or electrons are injected from the ETL into the HTL where they combine with holes to form excitons. Because excitons are trapped in the material having the lowest energy gap, and commonly used ETL materials generally have smaller energy gaps than commonly used HTL materials, the emissive layer of a single heterostructure device is typically the ETL. In such an OLED, the materials used for the ETL and HTL should be chosen such that holes can be injected efficiently from the HTL into the ETL. Also, the best OLEDs are believed to have good energy level alignment between the HOMO levels of the HTL and ETL materials.

In a double heterostructure OLED, holes are injected from the HTL and electrons are injected from the ETL into the separate emissive layer, where the holes and electrons combine to form excitons.

Various compounds have been used as HTL materials or ETL materials. HTL materials mostly consist of triaryl amines in various forms which show high hole mobilities ($\sim 10^{-3}$ cm$^2$/Vs). One common HTL material is 4,4'-bis[N-(1-naphthyl)-N-phenyl-amino]biphenyl ($\alpha$-NPD), having the structure:

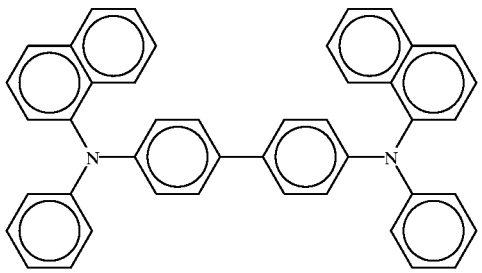

There is somewhat more variety in the ETLs used in OLEDs. A common ETL material is aluminum tris(8-hydroxyquinolate) (Alq$_3$), having the structure:

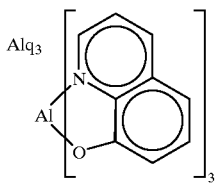

Other common ETL materials include oxidiazol, triazol, and triazine.

A number of technological challenges related to OLEDs need further attention, including increasing device lifetime and developing OLEDs that emit bright, saturated colors. Typically, the broad electroluminescence (EL) spectrum of OLEDs results in unsaturated emission colors which can be narrowed using, for example, an absorption filter or microcavity. Unfortunately, these methods can lead to a reduction in the OLED quantum efficiency or a strong angular dependence of the emitted color. It is therefore desirable to develop an OLED which emits a saturated color without the assistance of such external filters. Achievement of saturated and bright red OLEDs has proven to be particularly difficult.

Dyes have been used as dopants in the emissive layers of OLEDs to affect the wavelength and increase the efficiency of light emission. Molecules of the host transfer excitons to molecules of the dye through a non-radiative process. The exciton then recombines on the dye, and emits a photon having a wavelength characteristic of the dye, as opposed to the host. Several of these dyes are polar molecules, i.e., are molecules having a significant dipole moment, such as DCM1 and DCM2. DCM1 has a molecular structure represented by the formula:

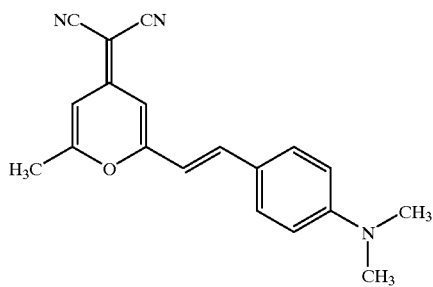

DCM2 has a structure represented by the formula:

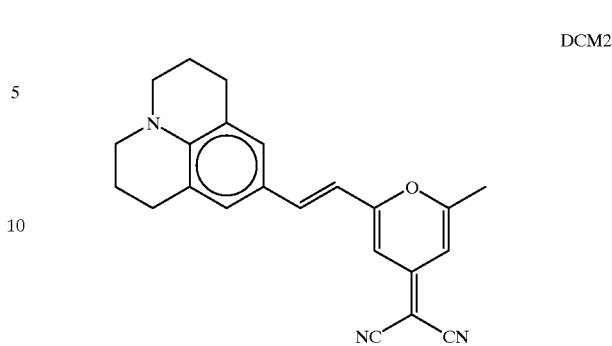

DCM2 has been described as a red emitting chromophore useful in OLED applications. C. W. Tang et al., *Electroluminescence of doped organic thin films*, J. Appl. Phys. 65, 3610 (1989). Indeed, OLEDs based on Alq$_3$ doped with DCM2 are shown to exhibit very high brightness. Tang et al. also observed that the emission of Alq$_3$ doped with DCM1 undergoes a spectral shift towards higher wavelengths as the concentration of DCM1 is increased, and attributed this spectral shift to excimer formation. Id. Tang et al. also observed that, with increasing concentration of DCM 1, the efficiency of the emission at first increases, and then decreases.

DCM2 has also been described as showing promise as a laser material. M. Berggren et al., *Light amplification in organic thin films using cascade energy transfer*, Nature 389, 466(1997).

In studies of solutions of quinacridone in polar solvents, J. Kalinowski et al., *Electroabsorption study of excited states in hydrogen-bonding solids: epindolidone and linear trans-quinacridone*, Chem. Phys. 182, 341(1994), spectral shifting has been attributed to hydrogen bonding in solution.

A red shift in the emission of DCM1 has been observed for DCM1 in polar solvents. M. Martin et al., *Ultrafast intramolecular charge transfer in the merocyanine dye DCM*, Chem. Phys. 192, 367 (1995).

SUMMARY OF THE INVENTION

A method is provided for tuning the wavelength of light emitted by an organic light emitting device. An emissive dopant molecule is selected, adapted to emit light when present as a dopant in an emissive layer of the organic light emitting device. The wavelength of light emitted by said emissive dopant molecule depends on the local dipole moment of the emissive layer. The local dipole moment of the emissive layer that would result in said emissive dopant molecule emitting a desired wavelength of light is determined, and an emissive layer is fabricated, doped with the emissive dopant molecule and having the local dipole moment that results in the emissive dopant molecule emitting the desired wavelength of light.

In an organic light emitting device comprising a heterostructure for producing luminescence, an emissive layer is provided, having a host material, an emissive molecule, present as a dopant in said host material, adapted to luminesce when a voltage is applied across the heterostructure, and a polarization molecule, present as a dopant in said host material and having a dipole moment, that affects the wavelength of light emitted when said emissive dopant molecule luminesces, wherein said wavelength depends on the concentrations of said polarization dopant molecule in said host material.

Representative examples of suitable materials include the following: the host material may be $Alq_3$, the emissive dopant molecule may be selected from the group consisting of DCM1 and DCM2, and the polarization dopant molecule may be yellow stilbene.

DETAILED DESCRIPTION

Figure 1:
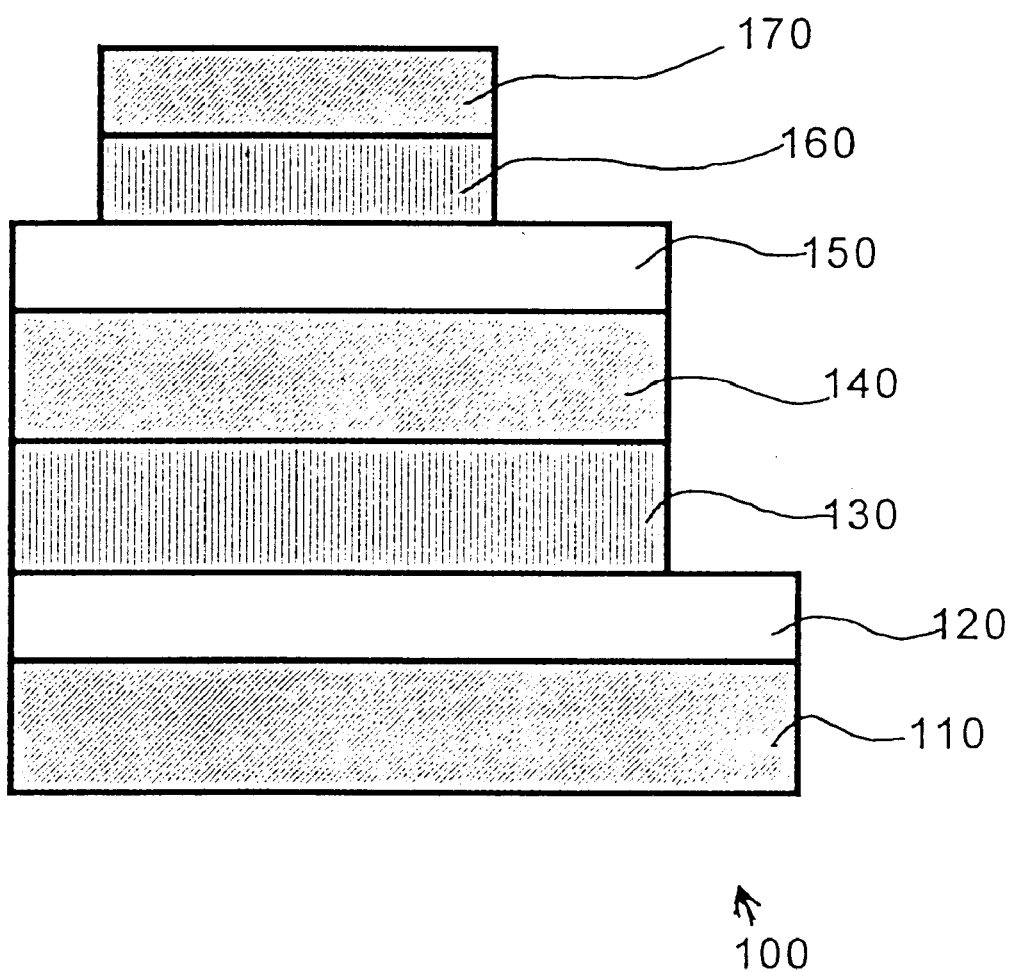
FIG. 1 shows a double heterostructure organic light emitting device.

A method is provided for tuning the wavelength of light emitted by an organic light emitting device. An emissive dopant molecule is selected, adapted to emit light when present as a dopant in an emissive layer of the organic light emitting device. The wavelength of light emitted by said emissive dopant molecule depends on the local dipole moment of the emissive layer. The local dipole moment of the emissive layer that would result in said emissive dopant molecule emitting a desired wavelength of light is determined, and an emissive layer is fabricated, doped with the emissive dopant molecule and having the local dipole moment that results in the emissive dopant molecule emitting the desired wavelength of light.

While not intending to be limited by any particular theory or mechanism for explaining exactly how or why the fields generated by neighboring polar molecules, referred to herein as the "local dipole moment," causes a shift in the wavelength of light emitted by an emissive dopant molecule, it is believed that the local dipole moment affects the orbital structure of an emissive molecule to the extent that the energy levels of the molecule may shift. The inventors' analysis shows that polar molecules within about 50–100 Å would provide significant contributions to the local dipole moment at the emissive molecule. In particular, it is believed that the gap between the lowest unoccupied molecular orbital (LUMO) and highest occupied molecular orbital (HOMO) of a polar molecule is decreased as the local dipole moment increases, because the local dipole moment affects the distribution of charge on the polar molecule, which will in turn affect the energy level positions. When an excited electron falls from the LUMO to the HOMO, a photon is emitted having an energy determined by the gap between the LUMO and HOMO. It is therefore possible to control the wavelength of light emitted by an emissive molecule in an OLED by controlling the gap between the LUMO and HOMO.

Prior explanations for the red-shifting of the emission of certain dopants are not consistent with the inventors' observations. For example, excimer formation would not result in the continuous, rigid shift of the EL spectrum shown in FIG. 2, while hydrogen bonding in solution is not possible for DCM2 molecules.

A local dipole moment is expected to affect the LUMO-HOMO gap of both non-polar and polar molecules (a molecule having a high dipole moment). However, it is expected that a local dipole moment will have a greater effect on the LUMO-HOMO gap of a polar molecule, relative to a less polar or non-polar molecule. As a result, the red-shift in the emission of the emissive dopant molecule due to a local dipole moment is expected to be greater if the emissive dopant molecule is a polar molecule. It is therefore expected a lower local dipole moment would be required to achieve a particular spectral shift for emissive dopant molecules having a high dipole moment. It is therefore preferable, that the emissive dopant molecule has a dipole moment above about 5 debyes, more preferably above about 7 debyes, and most preferably above about 10 debyes.

The inventors have demonstrated a shift in the spectral emission of OLEDs having an emissive layer of aluminum tris(8-hydroxyquinoline) ($Alq_3$) doped with DCM2, by changing the concentration of DCM2. As the concentration of DCM2 in $Alq_3$ was increased, the spectral emission changed from green to red, while the spectral width remained constant. This effect may be due to an increase in the local dipole moment of the $Alq_3$:DCM2 layer with increasing concentration of DCM2, a polar molecule. In particular, increasing the concentration of DCM2 increases the local dipole moment, which affects the LUMO-HOMO gap of DCM2, resulting in an emission that is red-shifted. However, the increase in DCM2 concentration also results in increase in formation of DCM2 aggregates. Aggregate formation at high DCM2 concentrations provides sites for non-radiative recombination (e.g. excimers), which reduce the possibility for radiative emission and decreases quantum efficiency.

A "polarization dopant molecule," i.e., a molecule that contributes to the local dipole moment, separate from the emissive dopant molecule, may be used as a dopant to increase the local dipole moment of the host without increasing the concentration of the emissive dopant molecule, thereby avoiding the formation of aggregates of the emissive dopant molecule and the resultant quenching and decrease in efficiency. Preferably, the polarization dopant molecule has a high dipole moment, more preferably has a dipole moment above about 5 debyes, more preferably above about 7 debyes, and most preferably above about 10 debyes. A high dipole moment allows the local dipole moment of the host to be changed using only small concentrations of the polarization dopant molecule.

The polarization dopant molecule is preferably transmissive in the spectral range corresponding to the OLED emission, and does not significantly interfere with the light emitted by the emissive dopant molecule. For example, a polarization dopant molecule having a LUMO-HOMO gap that is greater than the energy of a photon emitted by the emissive dopant molecule is unlikely to absorb such photons. Preferably, the polarization dopant molecule does not act as a carrier trap in $Alq_3$, and does not affect the conduction properties or current-voltage characteristics of the OLED. Preferably, the polarization dopant molecule does not provide radiative or non-radiative recombination sites for excitons. For example, a polarization dopant molecule having a LUMO-HOMO gap that is greater than the energy of an exciton on a molecule of the host is unlikely to accept the transfer of such an exciton.

The polarization dopant molecule may be doped into the emissive layer of an OLED at a high concentration, up to about 50%, without significantly adversely affecting OLED performance. However, at very high concentrations of dopant, above about 50%, OLED performance may be adversely affected by the decrease in the amount of the host and the emissive dopant molecule. The polarization dopant molecule is therefore preferably present in a concentration less than about 50%, and more preferably less than about 20%. Where the polarization dopant molecule has a dipole moment within the preferred ranges, it should be possible to attain the local dipole moment required to achieve emission of a particular wavelength from the emissive dopant molecule at concentrations of the polarization dopant molecule that are significantly less than about 20%.

One molecule that could be used as the polarization dopant molecule is yellow stilbene, having the structure:

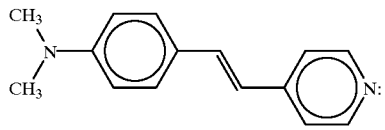

The local dipole moment in the emissive layer of the OLED may therefore be controlled by changing the concentration of the polarization dopant molecule, which in turn will affect the wavelength of light emitted by the emissive dopant molecule. Because the color tuning of the OLED is achieved by changing the concentration of the polarization dopant molecule, different colors of emission may be achieved while holding constant the concentration of the emissive dopant molecule. Preferably, the concentration of the emissive dopant molecule is low, just sufficient to maximize energy transfer from the host to the emissive dopant molecule, and the efficiency of the OLED. Because aggregates tend to form at higher concentrations of the emissive dopant molecule, keeping the concentration low keeps the density of aggregates low, and the OLED efficiency is kept high. For example, if the host is $Alq_3$ and the emissive dopant molecule is DCM2, the concentration of DCM2 is preferably between about 0.3% and 20%, more preferably between about 1% and 10%, and most preferably about 1%. If the emissive dopant molecule is also polar, the local dipole moment would depend on the concentrations of both the emissive dopant molecule and the polarization dopant molecule.

One or more emissive dopant molecules may be used, for example to achieve an OLED that emits white light. One or more polarization dopant molecules may be used, for example to achieve a higher local dipole moment than would be possible using only one polarization dopant molecule.

Over a large volume, the net dipole moment caused by dopants such as DCM2 averages to zero, because the molecules in the solid solution are randomly distributed. However, because the dipole field decreases as $1/r^3$, where r is the distance between dipoles, there is a net local dipole moment contribution from neighboring DCM2 molecules which, on average, influences the spectral emission of radiating DCM2 molecules. This local dipole moment can also be inferred from the dielectric constant for DCM2, which is somewhat higher than is typically observed for nonpolar molecular solids. As will be shown below, these local variations in the distribution of dipoles is also reflected in the luminescent efficiency of lightly DCM2 doped $Alq_3$ films.

The luminescence of DCM2 molecules is preceded by non-radiative Förster transfer of energy from $Alq_3$ to DCM2. The rate of energy transfer depends on the distance R between the host ($Alq_3$) and the guest (DCM2) molecules, and is given by Equation (1):

$$K_{H-G}(R) = \left(\frac{1}{\tau}\right)\left(\frac{R_0}{R}\right)^6 \quad (1)$$

where $R_0$ is the Förster radius, i.e., the average distance between host and dopant molecules, and $\tau$ is the average host exciton lifetime for recombination in the absence of energy transfer, corresponding to rate $K_\pi=1/96$. When $R=R_0$ then $K_{H-G}=K_H$, and the probability that an exciton will recombine at the host is equal to its transfer probability. Equation (1) describes the interaction of a single host molecule with a single guest molecule. In a doped thin film, however, the exciton on the host can interact with a distribution of dopant molecules, and hence the total rate of transfer is obtained by integrating over the film volume:

$$K_{H-G}^{TOT} = 4\pi \int_{R=2a}^{R=\infty} \left(\frac{1}{\tau}\right)^6 \rho_a Q R^2 = \left(\frac{1}{\tau}\right)\frac{R_0^6 Q}{8a^6} \quad (2)$$

Here, $\alpha$ is the radius of an $Alq_3$ molecule, and $\rho_\alpha=3/(4\pi\alpha^3)$. The probability for exciton transfer from a host to a dopant molecule is then:

$$P_{H-G} = \frac{K_{H-G}^{TOT}}{K_H + K_{H-G}^{TOT}} \quad (3)$$

From Equations (2) and (3), and using data measured from $Alq_3$:DCM2 OLEDs, $R_0$ for those OLEDs can be estimated by determining the percentage of EL from $Alq_3$ and DCM2 as a function of the doping fraction, Q. A linear fit of the spectrum of a $Alq_3$:1% DCM2 OLED shows that 15% of the EL is due to direct radiative recombination of excitons on $Alq_3$, resulting in a small shoulder in the spectrum of such an OLED at $\lambda=520$ nm (See FIG. 2). Using an internal luminescence quantum efficiency of $\eta_{int}^{Alq}=0.32$ for $Alq_3$ thin films (as reported by D. Z. Garbuzov et al., *Chem. Phys. Lett*, 249, 433 (1996)), and assuming an efficiency of $\eta_{int}^{DCM2}=1.0$ for DCM2, it is estimated that about 35% of the excitons recombine on $Alq_3$ molecules without transferring to DCM2, or equivalently $P_{H-G}=65\%$, from which it can be inferred that $R_0=16$ Å. However, it is likely that $\eta_{int}^{DCM2}$ is less than unity since DCM2 molecules can interact with the $Alq_3$ host, resulting in non-radiative decay, in which case an even smaller fraction of excitons recombine on the $Alq_3$ molecules. For example, if it is assumed that $\eta_{int}^{DCM2}=0.33$, then $P_{H-G}=85\%$ and $R_0=19$ Å. This distance is within factor of two of $R_0=39$ Å calculated using the $Alq_3$ photoluminescent (PL) and DCM2 absorption spectral overlap in the Förster integral.

In considering the differences between these two estimates of $R_0$, it is noted that there are local variations in the distribution of DCM2 in $Alq_3$, as already inferred from analysis of the spectral shift. This inhomogeneity, however, is contrary to the assumptions used in Equation 2. To estimate the magnitude of the effects of these inhomogeneities, it is noted that, for a $Alq_3$:1% DCM2 OLED, the average separation between neighboring DCM2 monomers is about 5.3 $Alq_3$ molecules. With an $Alq_3$ molecular weight of 460 g/mol, and a thin film density of 1.3 g/cm³ (as reported by H. Schmidbaur et al., *Z. Naturforsch*, B 46, 901 (1991)), the average spacing between $Alq_3$ molecules is about 9.4 Å, from which an average DCM2 spacing of $d_{DCM2}$=50 Å can be estimated. In fact, some pairs of DCM2 molecules will be farther apart than $d_{DCM2}$, and some will be closer together. The net effect results in a higher probability for recombination at an $Alq_3$ molecule prior to transfer. The net effect of the inhomogeneous dopant distribution is therefore to increase the host and decrease the dopant luminescence, or equivalently $P_{H-G}$ (homogeneous) >$P_{H-G}$ (inhomogeneous). The inhomogeneous distribution of distances between DCM2 molecules in a $Alq_3$:1% DCM2 OLED has been modeled as a Gaussian distribution centered at $d_{DCM2}$=50 Å, with a full-width at half-maximum of w. With $R_0$=39 Å, calculated via the Förster integral, and w=12 Å to 15 Å, $P_{H-G}$ is 85% to 75%, in agreement with $P_{H-G}$ obtained from the EL spectral measurement. Local variations in the spacing between DCM2 dopant molecules may therefore account for the observed enhancement in $Alq_3$ luminescence.

In summary, it has been demonstrated that molecular polarization effects in small-molecular-weight organic thin films can significantly influence the emission spectra of the luminescent molecules. This effect was demonstrated by tuning the emission color of $Alq_3$:DCM2 OLEDs by varying the concentration of DCM2, shifting the peak of the EL spectrum by as much as 50 nm. The inventors' experimental results show that a $Alq_3$:1% DCM2 OLED has particularly high luminescence and external quantum efficiency when compared to known OLEDs that emit in the yellow to red region of the visible spectrum. However, luminescence and external quantum efficiency drop off at higher concentrations of DCM2.

The inventors analysis shows that it would be possible to shift the emission of an $Alq_3$:DCM2 OLED by doping the emissive layer with a polarization dopant molecule, such as yellow stilbene, that increases the local dipole moment without otherwise affecting the OLED properties. This polarization dopant molecule is preferably not emissive, and preferably does not accept excitons from the host material. Such a polarization dopant molecule can be used to red-shift the emission of the DCM2, without increasing the concentration of DCM2, thereby maintaining the high luminescence and external quantum efficiency of the $Alq_3$:1% DCM2 OLED.

The inventors' analysis also shows that other emissive molecules, such as DCM1, may be used instead of DCM2.

The inventors' analysis also shows that mechanisms other than Forster transfer may be used to create excitons on emissive molecules present as a dopant in a host. For example, Dexter transfer, which involves the tunneling of an excited electron from a molecule of the host to a molecule of the dopant, and the simultaneous tunneling of a non-excited electron from the dopant to the host, may produce excitons on the dopant.

Another such mechanism is the trapping of charge carriers on molecules of the dopant. For example, the LUMO levels of the host and dopant may be arranged such that the LUMO level of the dopant is lower than the LUMO level of the host, such that the dopant molecule would act as an electron trap. Once an electron is trapped on a particular dopant molecule, a hole would eventually jump the that molecule, producing an exciton. Similarly, the HOMO levels of the host and dopant may be arranged such that the HOMO level of the dopant is higher than the HOMO level of the host, such that the dopant molecule would act as a hole trap. Once a hole is trapped on a particular dopant molecule, an electron would eventually jump the that molecule, producing an exciton.

In addition, one or more dopants, referred to herein as "transfer" dopants, may be used to facilitate the transfer of energy from the host to the emissive dopant. For example, cascade doping may be used, which involves the non-radiative transfer of excitons from a molecule of the host through one or more transfer dopants to the emissive dopant. These intermediate transfers may be by Förster transfer, Dexter transfer, hole trapping or electron trapping that eventually leads to the formation of an exciton on the transfer dopant or the emissive dopant, or any other suitable mechanism.

One problem that may occur, particularly if dopants are used in high concentrations, is the recrystallization of dopant molecules. This problem may be addressed by doping with one or more additional dopants, referred to herein as "stabilizing" dopants, that prevent such recrystallization.

The OLEDs of the present invention are comprised of a heterostructure for producing electroluminescence which may be fabricated as a single heterostructure or as a double heterostructure. As used herein, the term "heterostructure for producing electroluminescence" refers to a heterostructure that includes for a single heterostructure, for example, a substrate, a hole injecting anode layer in contact with the substrate, a HTL in contact with the anode layer, an ETL in contact with the HTL, and an electrode injecting cathode layer in contact with the ETL. If the cathode layer is a metal cathode layer of Mg:Ag, then a metal protective layer, for example, made of a layer of Ag for protecting the Mg:Ag cathode layer from atmospheric oxidation, may also be present.

The heterostructure for producing electroluminescence may also include a protection layer and/or an injection enhancement layer between the anode layer and the HTL or the cathode layer and the ETL. The protection layer serves to protect the underlying organic layers from damage during deposition of an ITO layer, for example. An injection enhancement layer serves to enhance injection of holes from the anode into the adjacent HTL, such as disclosed in copending Ser. No. 08/865,491, now U.S. Pat. No. 5,998,803, for example, or to enhance injection of electrons from the cathode into the adjacent ETL, such as disclosed in copending application Ser. No. 08/964,863, and copending application entitled "Highly Transparent Non-Metallic Cathodes," (filed Apr. 3, 1998), Ser. No. 09/054,707 for example.

If a double heterostructure is used to produce electroluminescence, a separate emissive layer is included between the HTL and the ETL. The term "emissive layer" as used herein may refer either to the emissive electron transporting layer or emissive hole transporting layer of a single heterostructure or the separate emissive layer of a double heterostructure. The emissive layer of a double heterostructure is referred to as a "separate" emissive layer so as to distinguish it from the ETL of a single heterostructure, which may also be an emissive layer. The materials, methods and apparatus for preparing the organic thin films of a single or double heterostructure are disclosed, for example, in U.S. Pat. No. 5,554,220, which is incorporated herein in its entirety by reference.

Alternatively, the heterostructure for producing electroluminescence may have an inverted (IOLED) structure in which the sequence of layers deposited on the substrate is inverted, that is, an electron injecting cathode layer is in direct contact with the substrate, an electron transporting layer is in contact with the cathode layer, a hole transporting layer is in contact with the electron transporting layer, and a hole injecting anode layer is in contact with the hole transporting layer.

If the heterostructure for producing electroluminescence is included as part of a stacked OLED (SOLED), one or both of the electrodes of an individual heterostructure may be in contact with an electrode of an adjacent heterostructure. Alternatively, dependent on the circuitry used to drive the SOLED, an insulating layer may be provided between adjacent electrodes of two of the OLEDs in the stack.

The single or double heterostructures as referred to herein are intended solely as examples for showing how an OLED embodying the present invention may be fabricated without in any way intending the invention to be limited to the particular materials or sequence for making the layers shown. For example, a single heterostructure typically includes a substrate which may be opaque or transparent, rigid or flexible, and/or plastic, metal or glass; a first electrode, which is typically a high work function, hole-injecting anode layer, for example, an indium tin oxide (ITO) anode layer; a hole transporting layer; an electron transporting layer; and a second electrode layer, for example, a low work function, electron-injecting, metal cathode layer of a magnesium-silver alloy, (Mg:Ag) or of a lithium-aluminum alloy, (Li:Al).

Materials that may be used as the substrate in a representative embodiment of the present invention include, in particular, glass, transparent polymer such as polyester, sapphire or quartz, or substantially any other material that may be used as the substrate of an OLED.

Materials that may be used as the hole-injecting anode layer in a representative embodiment of the present invention include, in particular, ITO, Zn—In—$SnO_2$ or $SbO_2$, or substantially any other material that may be used as the hole-injecting anode layer of an OLED.

Materials that may be used in the HTL in a representative embodiment of the present invention include, in particular, N,N'-diphenyl-N,N'-bis(3-methylphenyl)1-1'biphenyl-4, 4'diamine (TPD), 4,4'-bis[N-(1-naphthyl)-N-phenyl-amino] biphenyl ($\alpha$-NPD) or 4,4'-bis[N-(2-naphthyl)-N-phenyl-amino]biphenyl ($\beta$-NPD). Materials that may be used as the ETL include, in particular, aluminum tris(8-hydroxyquinolate) ($Alq_3$), a carbazole, an oxadiazole, a triazole, a thiophene or oligothiophene group. Other materials that may be used as the separate emissive layer, if present, include, in particular, dye-doped $Alq_3$, or substantially any other material that may be used as the separate emissive layer of an OLED.

Materials that may be used as the electron-injecting, metal cathode layer in a representative embodiment of the present invention include, in particular, Mg—Ag, Li—Ag or Ca, or a non-metallic material such as ITO, such as disclosed in copending Ser. No. 08/964,863, or substantially any other material that may be used as the cathode layer of an OLED.

The insulating layer, if present, may be comprised of an insulating material such as $SiO_2$, $SiN_x$ or $AlO_2$, or substantially any other material that may be used as the insulating material of an OLED, which may be deposited by a variety of processes such as plasma enhanced chemical vapor deposition (PECVD), electron beam, etc.

The OLEDs of the present invention have the advantage that they can be fabricated entirely from vacuum-deposited molecular organic materials as distinct, for example, from OLEDs in which some of the layers are comprised of polymeric materials, which cannot be readily deposited using vacuum deposition techniques. A vacuum-deposited material is one which can be deposited in a vacuum typically having a background pressure less than one atmosphere, preferably about $10^{-5}$ to about $10^{-11}$ torr for vacuum deposition, or about 50 torr to about $10^{-5}$ torr for vapor deposition.

Although not limited to the thickness ranges recited herein, the substrate may be as thin as $10\mu$, if present as a flexible plastic or metal foil substrate, such as aluminum foil, or substantially thicker if present as a rigid, transparent or opaque, substrate or if the substrate is comprised of a silicon-based display driver; the ITO anode layer may be from about 500 Å (1 Å=$10^{-8}$ cm) to greater than about 4000 Å thick; the hole transporting layer from about 50 Å to greater than about 1000 Å thick; the separate emissive layer of a double heterostructure, if present, from about 50 Å to about 200 Å thick; the electron transporting layer from about 50 Å to about 1000 Å thick; and the metal cathode layer from about 50 Å to greater than about 1000 Å thick, or substantially thicker if the cathode layer includes a protective silver layer and is opaque.

Thus, while there may be substantial variation in the type, number, thickness and order of the layers that are present, dependent on whether the device includes a single heterostructure or a double heterostructure, whether the device is a SOLED or a single OLED, whether the device is a TOLED or an IOLED, whether the OLED is intended to produce emission in a preferred spectral region, or whether still other design variations are used, the present invention is directed to those devices in which the wavelength of the emission has been controlled using the local dipole moment of the emissive layer.

The subject invention as disclosed herein may be used in conjunction with co-pending applications: "High Reliability, High Efficiency, Integratable Organic Light Emitting Devices and Methods of Producing Same", Ser. No. 08/774, 119 (filed Dec. 23, 1996)now U.S. Pat. No. 6,046,543; "Novel Materials for Multicolor LED's", Ser. No. 08/850, 264 (filed May 2, 1997) now U.S. Pat. No. 6,045,930; "Electron Transporting and Light Emitting Layers Based on Organic Free Radicals", Ser. No. 08/774,120 (filed Dec. 23, 1996) now U.S. Pat. No. 5,811,833; "Multicolor Display Devices", Ser. No. 08/772,333 (filed Dec. 23, 1996) now U.S. Pat. No. 6,013,982; "Red-Emitting Organic Light Emitting Devices (LED's)", Ser. No. 08/774,087 (filed Dec. 23, 1996) now U.S. Pat. No. 6,048,630; "Driving Circuit For Stacked Organic Light Emitting Devices", Ser. No. 08/792, 050 (filed Feb. 3, 1997) now U.S. Pat. No. 5,757,139; "High Efficiency Organic Light Emitting Device Structures", Ser. No. 08/772,332 (filed Dec. 23, 1996)now U.S. Pat. No. 5,834,893; "Vacuum Deposited, Non-Polymeric Flexible Organic Light Emitting Devices", Ser. No. 08/789,319 (filed Jan. 23, 1997) now U.S. Pat. No. 5,844,363; "Displays Having Mesa Pixel Configuration", Ser. No. 08/794,595 (filed Feb. 3, 1997) now U.S. Pat. No. 6,091,195; "Stacked Organic Light Emitting Devices", Ser. No. 08/792,046 (filed Feb. 3, 1997) now U.S. Pat. No. 5,917,280; "High Contrast Transparent Organic Light Emitting Device Display", Ser. No. 08/821,380 (filed Mar. 20, 1997) now U.S. Pat. No. 5,986,401; "Organic Light Emitting Devices Containing A Metal Complex of 5-Hydroxy-Quinoxaline as A Host Material", Ser. No. 08/838,099 (filed Apr. 15, 1997) now U.S. Pat. No. 5,861,219; "Light Emitting Devices Having High Brightness", Ser. No. 08/844,353 (filed Apr. 18, 1997); now expired, now U.S. Pat. No. 6,125,226; "Organic Semiconductor Laser", Ser. No. 60/046,061 (filed May 9, 1997); now expired; "Organic Semiconductor Laser", Ser. No. 08/859,468 (filed May 19, 1997) now U.S. Pat. No. 6,111, 902; "Saturated Full Color Stacked Organic Light Emitting Devices", Ser. No. 08/858,994 (filed May 20, 1997) now U.S. Pat. No. 5,932,895; "An Organic Light Emitting Device Containing a Hole Injection Enhancement Layer", Ser. No. 08/865,491 (filed May 29, 1997) now U.S. Pat. No. 5,998,803; "Plasma Treatment of Conductive Layers", Ser. No. PCT/US97/10252; (filed Jun. 12, 1997); Patterning of Thin Films for the Fabrication of Organic Multi-Color Displays", Ser. No. PCT/US97/10289 (filed Jun. 12, 1997); "Double Heterostructure Infrared and Vertical Cavity Surface Emitting Organic Lasers", Ser. No. 60/053,176 (filed Jul. 18, 1997) which was converted to non-provisional application No. 09/010,594, now U.S. Pat. No. 6,16; "Oleds Containing Thermally Stable Asymmetric Charge Carrier Materials", Ser. No. 08/925,029 filed (Sep. 8, 1997), "Light Emitting Device with Stack of Oleds and Phosphor Downconverter", Ser. No. 08/925,403 (filed Sep. 9, 1997) now U.S. Pat. No. 5,874,803, "An Improved Method for Depositing Indium Tin Oxide Layers in Organic Light Emitting Devices", Ser. No. 08/928,800 (filed Sep. 12, 1997) now U.S. Pat. No. 5,981,306, "Azlactone-Related Dopants in the Emissive Layer of an Oled" (filed Oct. 9, 1997), Ser. No. 08/948,130, now U.S. Pat. No. 6,030,715, "A Highly Transparent Organic Light Emitting Device Employing A Non-Metallic Cathode", (filed Nov. 3, 1997), Ser. No. 60/064,005 (Provisional), now expired; "A Highly Transparent Organic Light Emitting Device Employing a Non-Metallic Cathode", (filed Nov. 5, 1997) now U.S. Pat. No. 5,981,306, Ser. No. 08/964,863, "Low Pressure Vapor Phase Deposition of Organic Thin Films" (filed Nov. 17, 1997), Ser. No. 08/972,156, "Method of Fabricating and Patterning Oleds", (filed Nov. 24, 1997), Ser. No. 08/977,205, now U.S. Pat. No. 6,013,538 "Method for Deposition and Patterning of Organic Thin Film", (filed Nov. 24, 1997), Ser. No. 08/976,666, now U.S. Pat. No. 5,953,587 "Oleds Doped with Phosphorescent Compounds", (filed Dec. 1, 1997), Ser. No. 08/980,986, "Organic Vertical-Cavity Surface-Emitting Laser Confirmation", (filed Jan. 22, 1998), Ser. No. 09/010, 594 now U.S. Pat. No. 6,160,828; "Electron Transporting and Light Emitting Layers Based on Organic Free Radicals", (filed Feb. 18, 1998), Ser. No. 09/025,660 now U.S. Pat. No. 5,922,396; "Method of Making a Display", (filed Mar. 30, 1998), Ser. No. 09/050,084; "Aluminum Complexes Bearing Both Electron Transporting and Hole Transporting Moieties" (filed Apr. 1, 1998), Ser. No. 09/053,030; "Highly Transparent Non-Metallic Cathodes" (filed Apr. 3, 1998), Ser. No. 09/054,707; and "OLEDs Containing Thermally Stable Glassy Organic Hole Transporting Materials" (filed Apr. 10, 1998) Ser. No. 09/058,305, now U.S. Pat. No. 6,150,043, each co-pending application being incorporated herein by reference in its entirety. The subject invention may also be used in conjunction with the subject matter of each of co-pending U.S. patent application Ser. No. 08/354,674 now U.S. Pat. No. 6,030,700, Ser. No. 08/613,207 now U.S. Pat. No. 5,703,436, Ser. No. 08/632,322 now U.S. Pat. No. 5,757,026 and Ser. No. 08/693,359 and provisional patent application Ser. No. 60/01,013 which was converted to a non-provisional application and issued as U.S. Pat. No. 5,986,268, Ser. No. 60/024,001 which was converted to a non-provisional application and issued as U.S. Pat. No. 5,844,363 and Ser. No. 60/025,501 which was converted to non-provisional Ser. No. 08/844,353, now U.S. Pat. No. 6,125,226, each of which is also incorporated herein by reference in its entirety.

OLEDs of the present invention may be fabricated using the materials and structures as disclosed in these co-pending applications.

The OLED of the present invention may be used in substantially any type of device which is comprised of an OLED, for example, in OLEDs that are incorporated into a larger display, a vehicle, a computer, a television, a printer, a large area wall, theater or stadium screen, a billboard or a sign.

This invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

Experiments

The inventors have demonstrated red, orange, and yellow OLEDs having an emissive layer comprising $Alq_3$ doped with DCM2. The color of the emission was controlled by varying the concentration of DCM2.

Double heterostructure OLEDs, as shown in FIG. 1, were fabricated. OLED 100 has an anode 120, a hole transporting layer 130, a separate emissive layer 140, an electron transporting layer 150, a cathode 160, and a cap 170, sequentially layered on a substrate 110. Substrate 110 and anode 120 were made of precleaned, indium-tin-oxide (ITO) coated glass, where substrate 110 is glass and anode 120 is ITO. Hole transporting layer 130, separate emissive layer 140, electron transporting layer 150, cathode 160, and cap 170 were grown, in that order, in a high vacuum ($10^{-6}$ Torr) by thermal evaporation, at deposition rates that ranged from about 1 to 5 Å/s. Hole transporting layer 130 is a 300 Å thick layer of 4,4'-bis[N-(1-naphthyl)-N-phenyl-amino]biphenyl (α-NPD), separate emissive layer 140 is a 300 Å thick layer of $Alq_3$ doped with from 1% to 10% by mass of DCM2, electron transporting layer 150 is a 100 Å thick layer of $Alq_3$, cathode 160 is a 500 Å thick layer of 25:1 Mg:Ag alloy, and cap 170 is a 1000 Å thick layer of Ag. Cathode 160 and cap 170 were deposited through a shadow mask to define 1 mm diameter circular cathodes 160 and caps 170. OLEDs were fabricated having a separate emissive layer 140 that is $Alq_3$:1% DCM2 (Q=0.01), $Alq_3$:2% DCM2 (Q=0.02), $Alq_3$:5% DCM2 (Q=0.05), and $Alq_3$:10% DCM2 (Q=

Figure 2:
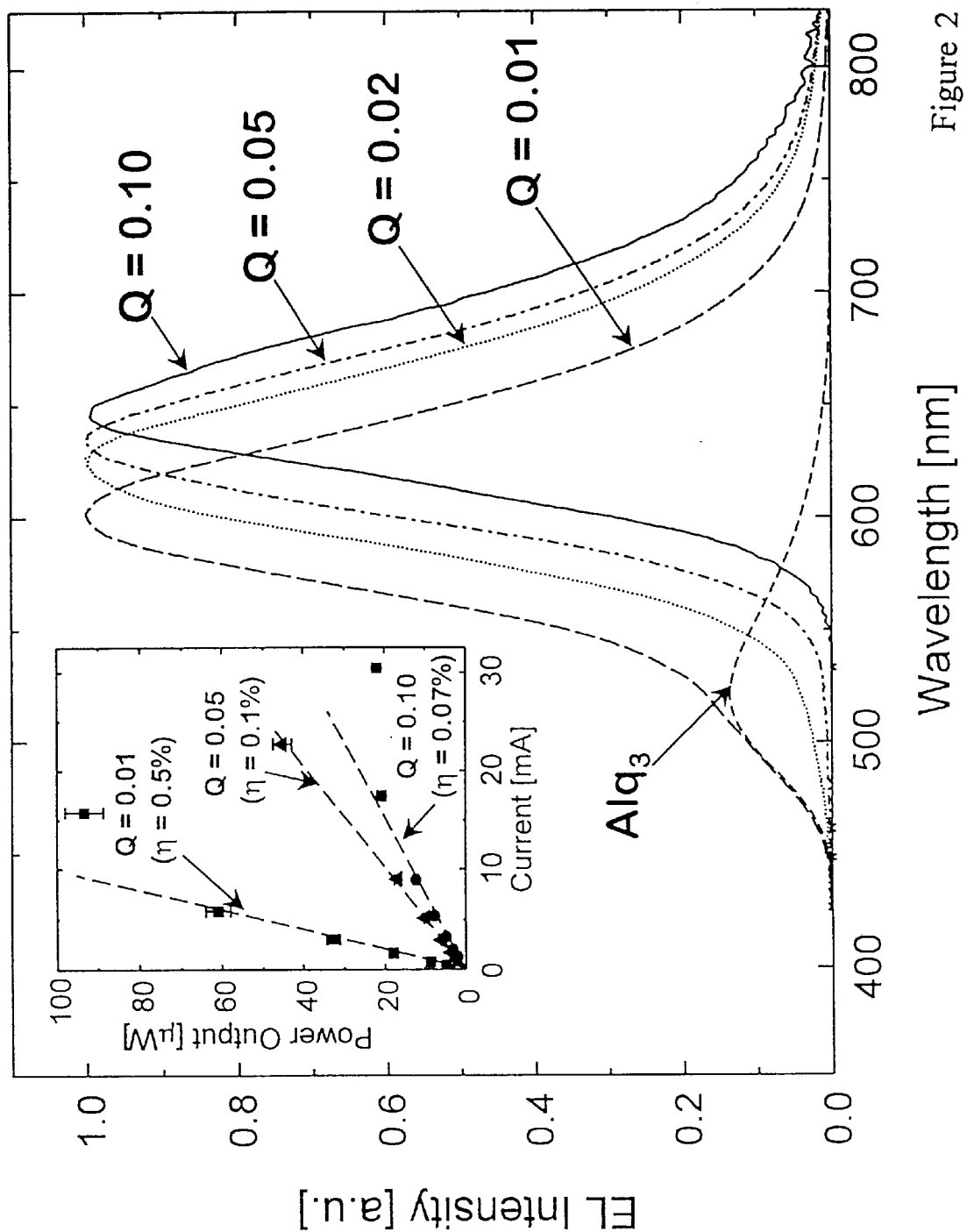
FIG. 2 shows electroluminescent (EL) spectra for the OLEDs of FIG. 1, having an $Alq_3$:DCM2 separate emissive layer, for various concentrations of DCM2. The inset shows plots of power output v. current for the OLEDs.

As shown in FIG. 2, the concentration of DCM2 in separate emissive layer 140 strongly influenced the OLED electroluminescence (EL) spectrum and efficiency. As the DCM2 concentration in $Alq_3$ was increased from 1% to 10% (represented by Q increasing from 0.01 to 0.10 in FIG. 2), the output spectrum of OLEDs 100 was red shifted by 50 nm, with a relatively unchanged peak width. This shift is accompanied by a concomitant decrease in the external EL quantum efficiency from $\eta=0.5\%$ to $\eta=0.07\%$, as shown in the plots of output optical power vs. input current (L-I) in the inset of FIG. 2. The pronounced red shift on increasing DCM2 concentration can be understood by examining FIG. 3 and Table 2. FIG. 2 also shows the contribution of emission from $Alq_3$ to the emission of the $Alq_3$:1% DCM2 OLED.

Figure 3:
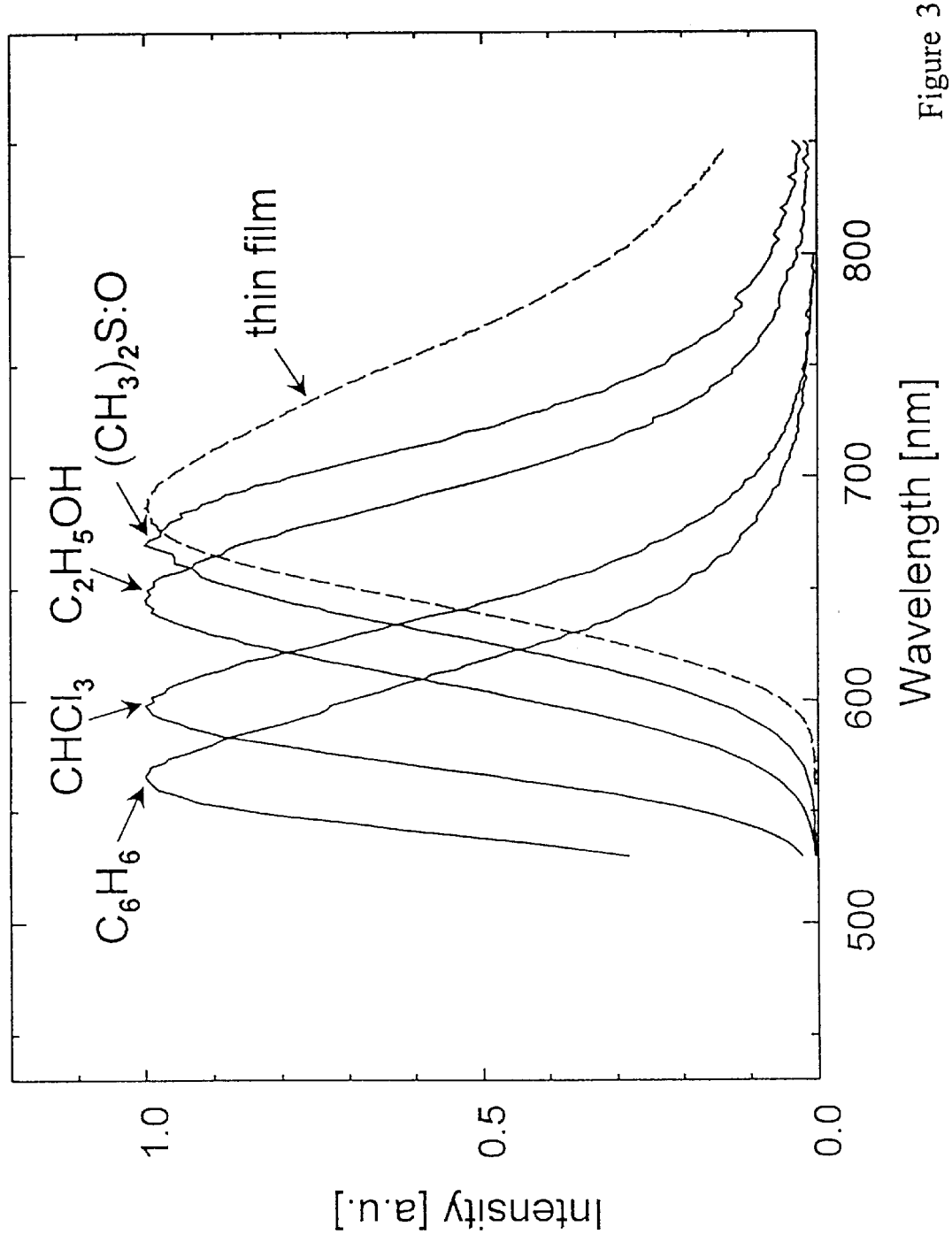
FIG. 3 shows photoluminescent (PL) spectra for DCM2 in various polar and non-polar solvents, as well as a PL spectra for a neat thin film of DCM2.

FIG. 3 shows normalized photoluminescence (PL) spectra for DCM2 in a variety of solutions, as well as the PL spectrum of a neat thin film of DCM2. The solutions are very dilute solutions of DCM2 (~1/1000 of the saturated solution concentration) in various polar and non-polar solvents, including benzene ($C_6H_6$), chloroform ($CHCl_3$), ethanol ($C_2H_5OH$), and DMSO (($CH_3$)$_2$S:O). Such dilute solutions ensure that the spectra observed are due to monomer fluorescence, and that the contribution from aggregate luminescence is negligible. The solutions were optically excited using a multi-wavelength Ar ion laser, having a λ (wavelength) between about 460 nm and 514 nm, and the PL emissions were measured to give the results shown in FIG. 3. There was no significant difference in the quantum yield of any of the solutions.

Table 1 shows the dipole moment $\mu$ and the dielectric constant $\in$ for various liquid and thin film solutions, and the peak emission wavelength $\lambda_{max}$ of DCM2 in these solutions:

TABLE 1

| Material | μ (debyes) | ϵ | λ_max (nm) |
|---|---|---|---|
| LIQUIDS | | | |
| Benzene (C_6H_6) | 0 | 2.27 | 565 |
| Chloroform (CHCl_3) | 1.15 | 4.81 | 595 |
| ethanol (C_2H_5OH) | 1.69 | 24.3 | 645 |
| DMSO (CH_3)_2S:O | 3.9 | 46.7 | 675 |
| THIN FILMS | | | |
| Alq_3 | 5.5 | 2.96 | 520 |
| Alq_3:1% DCM2 | 5.56 | 2.97 | 600 |
| Alq_3:2% DCM2 | 5.61 | 2.98 | 625 |
| Alq_3:5% DCM2 | 5.78 | 3.01 | 640 |
| Alq_3:10% DCM2 | 6.0 | 3.06 | 650 |
| DCM2 | 11.3 | 4.0 | 685 |

Values for $\mu$ and $\in$ for the solvents are from "Solvent Guide," J. T. Przybytek, Ed., Jackson Laboratories, 2nd Ed. (1982) and "Handbook of Chemistry and Physics," R. C. Weast, Ed., 56th Ed., CRC Press (1976). For Alq_3 and DCM2, semi-empirical molecular orbital calculations based on an intermediate neglect of differential overlap algorithm, parametrized from solution electronic spectra for the optimized molecular geometrics, were used to obtain $\mu$. For Alq3 and DCM2, $\in$ was as inferred from the refractive index of DCM2, measured ellipsometrically. For Alq_3:DCM2 thin film solutions, $\mu$ and $\in$ were calculated by linear extrapolation from the values for the constituent compounds.

Table 1 shows a high correlation between the dipole moment of the solution and the peak emission wavelength $\lambda_{max}$ of DCM2, where $\lambda_{max}$ is red shifted for solutions having a higher dipole moment. For DCM2 in liquid solutions, $\lambda_{max}$ varies from 565 nm for the nonpolar solvent, benzene, with a dielectric constant of $\in=2.27$, to 675 nm for dimethylsufoxide (DMSO) with a dipole moment of 3.9 D and $\in=46.7$. For DCM2 in thin film solutions with Alq_3, $\lambda_{max}$ varies from 600 nm for Alq_3:1% DCM2 to 650 nm for Alq3: 10% DCM2. Indeed, the PL of the neat DCM2 thin film is shifted to $\lambda_{max}=685$ nm, a shift of 120 nm from DCM2 in a non-polar solvent.

The broad emission spectrum of the OLEDs yields a saturated color that is dependent on the concentration of DCM2 in Alq_3, and has an external quantum efficiency of as high as 0.5%. A shift of 50 nm in the peak emission wavelength of the OLEDs was observed as DCM2 concentration was increased from 1% to 10%. For red and yellow-orange OLEDs, a maximum luminance of 1400 cd/m² and 15200 cd/m² is measured, respectively. The current vs. voltage dependencies of these devices are consistent with trap-limited conduction, unaffected by the presence of DCM2. A luminance of 100 cd/m² is attained at 100 mA/cm² and 14 V for the red Alq_3:10% DCM2 OLED, whereas the same luminance intensity is attained at 10 mA/cm² and 12 V for the yellow-orange Alq_3:1% DCM2 OLED. The ten times higher current of the red OLED is due to the lower quantum efficiency of these OLEDs, as well as to the lower photopic response of the human eye to red as compared to yellow light.

The similarity of the spectral widths, and the magnitudes of the peak shifts in FIGS. 2 and 3, suggests that DCM2 suspended in a solid matrix of Alq_3 undergoes an energy shift due to self-polarization. That is, as the DCM2 concentration in the relatively non-polar Alq_3 is increased, the distance between nearest neighbor, highly polar, DCM2 molecules decreases, thereby increasing the local polarization field, which tends to red-shift the DCM2 emission spectrum. The effect is increased until the DCM2 concentration is 100% in an undiluted DCM2 film, where $\lambda_{max}$ is close to that attained for DCM2 in the polar solvent, DMSO. By comparison, the most dilute solution of 1% DCM2 in Alq_3 has $\lambda_{max}=600$ nm, which is similar to that for DCM2 in CHC13, which has a dipole moment of 1.15 D (and $\in=4.81$). This suggests that even at concentrations as low as 1%, the emission of DCM2 in a Alq_3:DCM2 OLED is influenced by the presence of other DCM2 molecules, given that a smaller shift than that observed would be expected from interactions only with the less polar Alq_3.

Figure 4:
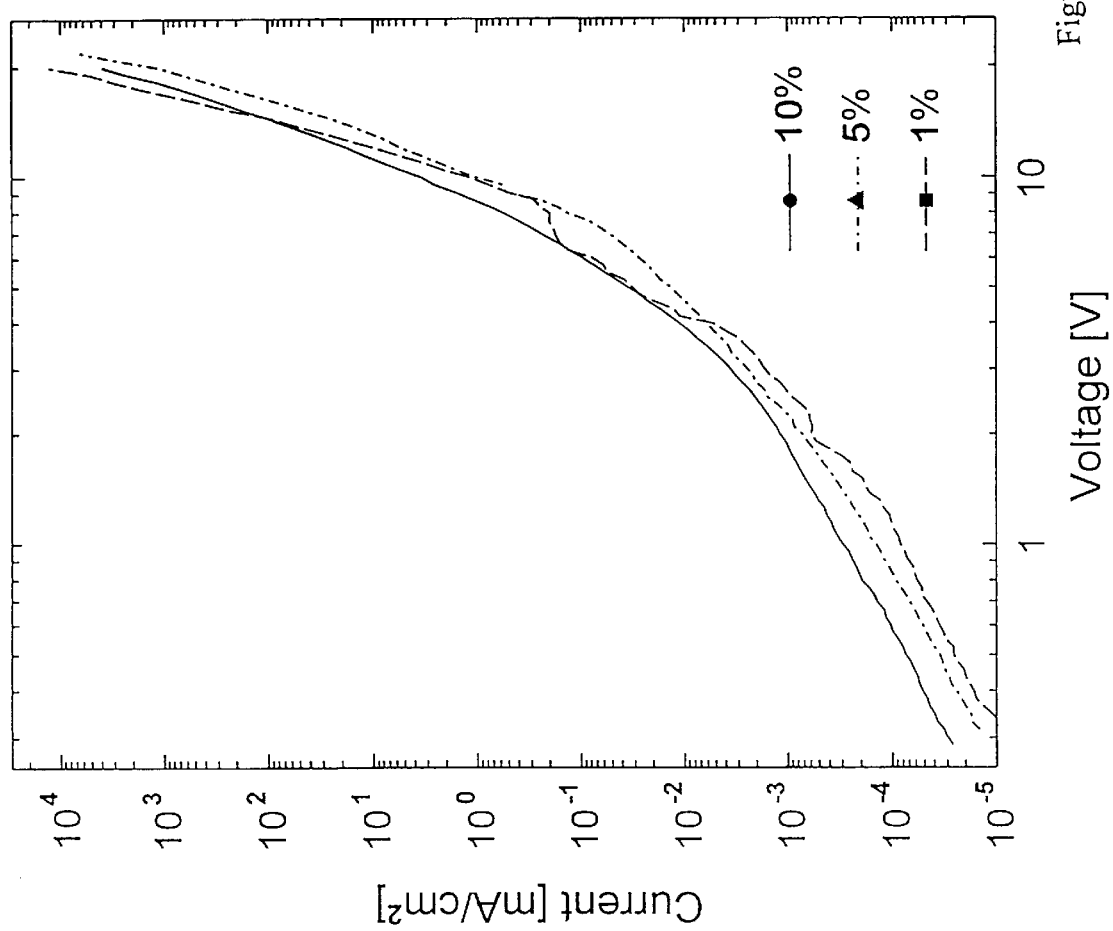
FIG. 4 shows current v. voltage (I–V) plots for OLEDs having an $Alq_3$:DCM2 separate emissive layer, for various concentrations of DCM2.

FIG. 4 shows forward biased current-voltage (I–V) characteristics of Alq_3:DCM2 OLEDs. These I–V characteristics are similar to those previously reported for other OLEDs, where trap-limited conduction ($I \propto V^{m+1}$) is observed. See P. E. Burrows et al., J. Applied Physics 79, 7991 (1996). For Alq_3:DCM2, an m of 11±1 is observed at high applied voltage, independent of the concentration of DCM2. At lower voltages, an m of about 2 is observed, characteristic of space-charge limited transport. Concentrations of DCM2 in Alq_3 do not therefore significantly influence the Alq3 trap distribution. As previously concluded, FIG. 4 shows that the I–V characteristics of Alq_3:DCM2 OLEDs are primarily limited by bulk currents in the Alq3, at least for DCM2 concentrations of up to 10%.

Figure 5:
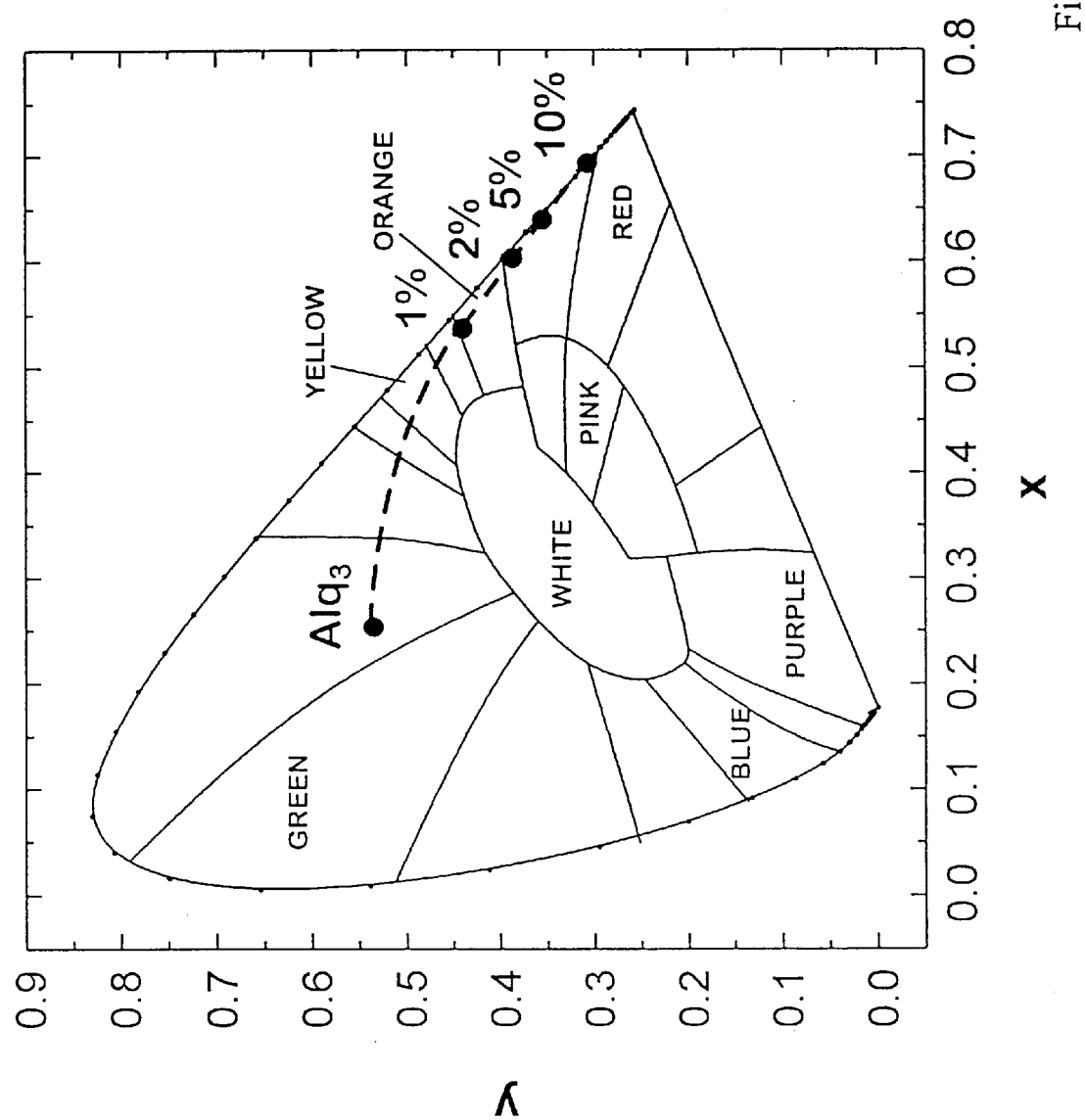
FIG. 5 shows the color of emission of the OLEDs, plotted on a CIE chromaticity diagram.

FIG. 5 shows the chromaticity coordinates of Q=0.01, 0.02, 0.05, and 0.10 DCM2:Alq_3 OLEDs, as well as an undoped α-NPD/Alq_3 device. Saturated red emission is observed for an Alq_3:10% DCM2 OLED, and yellow-orange emission for the Alq_3:1% DCM2 OLED. At concentrations of DCM2 lower than 1%, yellow and yellow-green EL emission should also be achievable.

Table 2 shows the electroluminescence characteristics of selected OLEDs with emission between red and yellow, including maximum reported luminance under DC bias ($L_{MAX}$), current and voltage at $L_{MAX}$, external quantum efficiency of photons per electron (η), CIE coordinates, and perceived color.

TABLE 2

| Material/Method | $L_{MAX}$ [cd/m²] | (I, V) [mA/cm², V] @ $L_{MAX}$ | η [%] | CIE (x, y) - color | Ref. |
|---|---|---|---|---|---|
| Alq_3:10% DCM2 | 1400 | (2200, 19) | 0.07 | (0.64, 0.36) - red | THIS |
| Alq_3:1% DCM2 | 15200 | (2000, 17) | 0.5 | (0.54, 0.44) - yellow | WORK |
| Eu(DBM)_3(phen) in PBD | 460 | (300, 16) | — | (0.68, 0.32) - red | [1] |

TABLE 2-continued

| Material/Method | $L_{MAX}$ [cd/m$^2$] | (I, V) [mA/cm$^2$, V] @ $L_{MAX}$ | η [%] | CIE (x, y) - color | Ref. |
|---|---|---|---|---|---|
| Eu(TTA)$_3$ (phen) in 1AZM-Hex (Q = 0.05) | 137 | (200, —) | 0.03 | (0.68, 0.32) - red | [2] |
| Luminescent Blue PL Conversion & Filtering | 120 | (20, 10) | — | (0.65, 0.32) - red | [3] |
| TPP in Alq$_3$ (Q = 0.03) | 60 | (45, 35) | 0.11 | (0.68, 0.32) - red | [4] |
| Eu (TTA)$_3$(phen) | 30 | (100, 16) | — | (0.68, 0.32) - red | [5] |
| Eu (ttfa)$_3$ in PMPS | 0.3 | (22, 18) | 0.001 | (0.69, 0.13) - red | [6] |
| DCM1 in Alq$_3$ (Q = 0.10) | 150 | (—, 10) | — | (0.62, 0.36) - red | [7] |
| DCM1 in Alq$_3$ (Q = 0.0025) | — | (65, —) | 2.3 | (0.57, 0.43) orange | [8] |
| DCM1 in Alq$_3$ | — | (—, —) | 0.03 | (0.57, 0.43) orange | [9] |

The Alq3:DCM2 OLED data of Table 2 is from the inventor's own work, while the other data is from the literature. The data from the literature falls into two categories: OLEDs with a guest:host EL layer:[1] J. Kido et al., Appl. Phys. Lett., 65, 2124 (1994); [2] T. Sano et al., Japan J. Appl. Phys., 34, 1883 (1995); [4] Z. Shen et al., Science, 276, 2009 (1997); [5] T. Tsutsui et al., Appl. Phys. Lett, 65, 1868 (1994); [6] J. Kido et al., J. Alloys and Compounds, 192, 30 (1993); [7] Y. Kijima et al., IEEE Transactions on Electron Devices, 44, 1222 (1997); [8] C. W. Tang et al., J. Appl. Phys., 65, 3610 (1989); [9] J. Littman et al., J. Appl. Phys., 72, 1957 (1992); and structures filtered by microcavity band-pass filters: [3], S. Tasch et al., Adv. Mater., 9, 33 (1997). The chemical names and/or structures of the molecules referred to in the table can be determined from these cited references, which are incorporated herein by reference. For OLEDs exhibiting saturated red emission, DCM2-doped Alq$_3$ devices have the highest maximum brightness and an external quantum efficiency comparable to the highest efficiencies reported elsewhere. The high luminescence and external quantum efficiency of the Alq$_3$:DCM2 OLEDs, particularly for Alq$_3$:1% DCM2, indicates that Alq$_3$:DCM2 OLEDs have significant potential.

What is claimed is:

1. In an organic light emitting device comprising a heterostructure for producing luminescence, an emissive layer, comprising:

a host charge carrying material;

an emissive dopant molecule, present as a dopant in said host material, which luminesces when a voltage is applied across the heterostructure; and a polarization dopant molecule, present as a dopant in said host material and having a dipole moment, that affects the wavelength of light emitted when said emissive dopant molecule luminesces, wherein said wavelength depends on the concentrations of said polarization dopant molecule in said host material, wherein said polarization dopant molecule is present in a concentration such that light emitted when said emissive dopant molecule luminesces has a desired wavelength, and wherein said polarization dopant molecule is not the same material as said emissive dopant molecule.

2. The organic light emitting device of claim 1, wherein said host material is tris-(8-hydroxyquinoline)-aluminum (Alq$_3$).

3. The organic light emitting device of claim 1, wherein said emissive dopant molecule is DCM2, wherein DCM2 has the chemical structure:

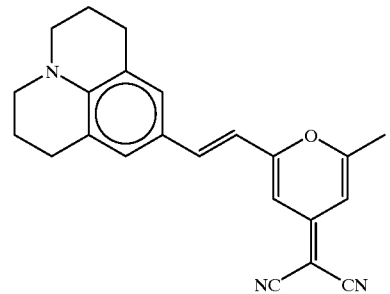

4. The organic light emitting device of claim 3, wherein the concentration of said DCM2 in said host material is about 0.3 weight % to 20 weight % based on the weight of the host material.

5. The organic light emitting device of claim 3, wherein the concentration of said DCM2 in said host material is about 1 weight % to 10 weight % based on the weight of the host material.

6. The organic light emitting device of claim 3, wherein the concentration of said DCM2 in said host material is about 1 weight % based on the weight of the host material.

7. The organic light emitting device of claim 1, wherein said emissive dopant molecule is DCM1, wherein DCM1 has the chemical structure:

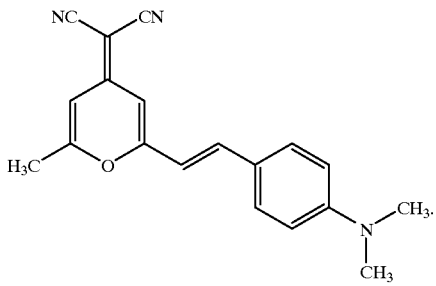

8. The organic light emitting device of claim 1, wherein said polarization dopant molecule is yellow stilbene, and wherein yellow stilbene has the structure:

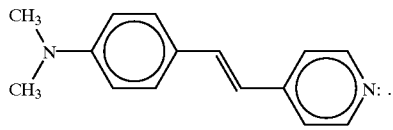

9. The organic light emitting device of claim 1, wherein said emissive dopant molecule has a dipole moment of at least about 5 debyes.

10. The organic light emitting device of claim 1, wherein said emissive dopant molecule has a dipole moment of at least about 7 debyes.

11. The organic light emitting device of claim 1, wherein said emissive dopant molecule has a dipole moment of at least about 10 debyes.

12. The organic light emitting device of claim 1, wherein said polarization dopant molecule has a dipole moment of at least about 5 debyes.

13. The organic light emitting device of claim 1, wherein said polarization dopant molecule has a dipole moment of at least about 7 debyes.

14. The organic light emitting device of claim 1, wherein said polarization dopant molecule has a dipole moment of at least about 10 debyes.

15. The organic light emitting device of claim 1, wherein the concentration of said emissive dopant molecule in said host material is about 0.3 weight % to 20 weight % based on the weight of the host material.

16. The organic light emitting device of claim 1, wherein the concentration of said emissive dopant molecule in said host material is about 1 weight % to 10 weight % based on the weight of the host material.

17. The organic light emitting device of claim 1, wherein the concentration of said emissive dopant molecule in said host material is about 1 weight % based on the weight of the host material.

18. A method for tuning the color emitted by an organic light emitting device, comprising:
fabricating an organic light emitting device including an emissive layer, wherein the fabrication includes the steps of
fabricating said emissive layer wherein said emissive layer comprises a host charge carrying material doped with at least one emissive dopant molecule and at least one polarization dopant molecule, wherein said polarization dopant molecule is not the same material as said emissive dopant molecule, wherein said emissive dopant molecule emits light when present as a dopant in said emissive layer, and wherein the color emitted by said emissive dopant molecule depends on the local dipole moment of said emissive layer; and
adjusting the concentration of said polarization dopant molecule in said emissive layer so as to produce emission of a desired color when a voltage is applied across said organic light emitting device.

19. The method of claim 18, wherein said emissive layer is doped with a plurality of different emissive dopant molecules.

20. The method of claim 18, wherein said emissive dopant molecule is DCM2, wherein DCM2 has the chemical structure:

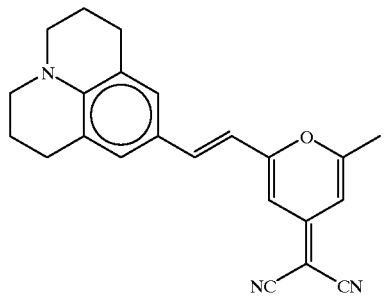

21. The method of claim 18, wherein said emissive layer comprises a plurality of polarization dopant molecules each having dipole moments, and wherein the local dipole moment of said emissive layer is dependent on the concentrations of said polarization dopant molecules present in said emissive layer.

22. The method of claim 18, wherein said polarization dopant molecule is yellow stilbene, wherein yellow stilbene has the chemical structure:

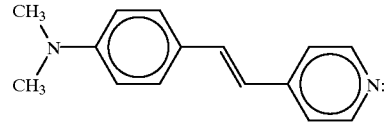

23. The method of claim 18, wherein the host material of said emissive layer is aluminum tris(8-hydroxyquinolate) ($Alq_3$).

24. The method of claim 18, wherein said emissive layer is further doped with one or more transfer dopants.

25. The method of claim 18, wherein said emissive layer is further doped with one or more stabilizing dopants.

26. The method of claim 18, wherein said polarization dopant molecule has a dipole moment of at least about 5 debyes.

27. The method of claim 18, wherein said polarization dopant molecule has a dipole moment of at least about 7 debyes.

28. The method of claim 18, wherein said polarization dopant molecule has a dipole moment of at least about 10 debyes.

29. A display comprising at least one organic light emitting device, wherein the color emitted by at least one of said organic light emitting devices is tuned by the method of claim 18.

30. A vehicle comprising at least one organic light emitting device, wherein the color emitted by at least one of said organic light emitting devices is tuned by the method of claim 18.

31. A computer comprising at least one organic light emitting device, wherein the color emitted by at least one of said organic light emitting devices is tuned by the method of claim 18.

32. A television comprising at least one organic light emitting device, wherein the color emitted by at least one of said organic light emitting devices is tuned by the method of claim 18.

33. A printer comprising at least one organic light emitting device, wherein the color emitted by at least one of said organic light emitting devices is tuned by the method of claim 18.

34. A device selected from the group consisting of a large area wall, a theatre and a stadium screen, comprising at least one organic light emitting device, wherein the color emitted by at least one of said organic light emitting devices is tuned by the method of claim 18.

35. A billboard comprising at least one organic light emitting device, wherein the color emitted by at least one of said organic light emitting devices is tuned by the method of claim 18.

36. A sign comprising at least one organic light emitting device, wherein the color emitted by at least one of said organic light emitting devices is tuned by the method of claim 18.

37. The method of claim 18 wherein said organic light emitting device emits a saturated color.

38. The method of claim 18 wherein said organic light emitting device emits a saturated red color.

* * * * *

UNITED STATES PATENT AND TRADEMARK OFFICE
CERTIFICATE OF CORRECTION

PATENT NO. : 6,287,712 B1
DATED : September 11, 2001
INVENTOR(S) : Bulovic et al.

It is certified that error appears in the above-identified patent and that said Letters Patent is hereby corrected as shown below:

Column 1,
Line 45, change "Mg-Ag13 ITO" to -- Mg-Ag-ITO --;

Column 8,
Line 41, after "Chem." change "Phvs." to -- Phys --; and

Column 14,
Line 34, after "DCM2" (last occurrence) change "(Q=" to -- (Q=0.10) --.

Signed and Sealed this

Eleventh Day of June, 2002

Attest:

JAMES E. ROGAN
Attesting Officer    Director of the United States Patent and Trademark Office